United States Patent [19]

Gousset et al.

[11] Patent Number: 4,992,924
[45] Date of Patent: Feb. 12, 1991

[54] DRIVE CIRCUIT FOR A POWER TRANSISTOR

[75] Inventors: Alain Gousset, Rueil Malmaison; Jean Lafontaine, Maisons Laffitte, both of France

[73] Assignee: Telemecanique, France

[21] Appl. No.: 440,189

[22] Filed: Nov. 22, 1989

[30] Foreign Application Priority Data

Nov. 22, 1988 [FR] France ................. 88 15162

[51] Int. Cl.$^5$ .............................................. H02M 1/08
[52] U.S. Cl. .................................... 363/132; 307/253; 307/300; 323/289
[58] Field of Search .................. 363/37, 98, 131, 132; 323/289; 307/254, 300

[56] References Cited

U.S. PATENT DOCUMENTS

| 4,236,089 | 11/1980 | Baker | 307/254 |
| 4,775,803 | 10/1988 | Mori | 323/289 |

FOREIGN PATENT DOCUMENTS

| 2535543 | 5/1984 | France . | |
| 6080 | 1/1983 | Japan | 363/132 |
| 70980 | 4/1985 | Japan | 363/132 |
| 270914 | 12/1986 | Japan . | |

*Primary Examiner*—William H. Beha, Jr.
*Attorney, Agent, or Firm*—William A. Drucker

[57] ABSTRACT

A power switching circuit (T115, T5) including at least one bipolar transistor stage (T5) and a control circuit for that stage, the control circuit including first bias means for applying forward bias to that stage during first time intervals (t3), and second bias means for applying reverse bias to that stage during second time intervals (t2, t4), the reverse bias being intended to prevent charge accumulating in the transistor while it is subjected to a reverse voltage. The first bias means comprise a first capacitor (C108) and a first switching circuit (D120, T113) serving, outside the first time intervals, for selectively charging the first capacitor by means of a DC voltage soruce, and for discharging the first capacitor into a control input (T115-G) of that stage; and the second bias means comprise a second capacitor (C107) and a second switching circuit (D119, D123, T113, T114) serving, outside the second time intervals, for selectively charging the second capacitor from the voltage supply, and for discharging the second capacitor into the control input.

13 Claims, 2 Drawing Sheets

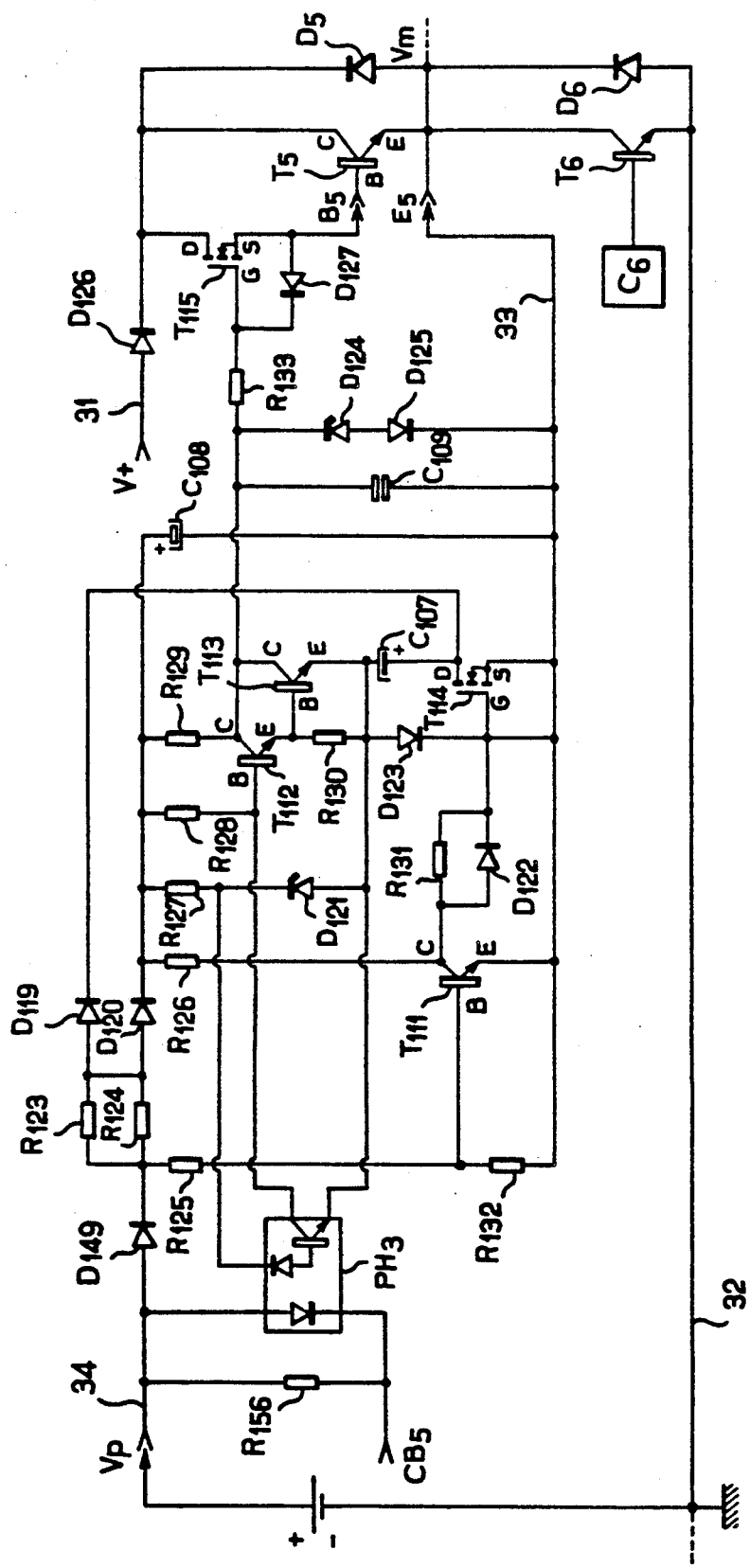
FIG_3

DRIVE CIRCUIT FOR A POWER TRANSISTOR

The present invention relates in general to controlling power, transistors, and more particularly, but not exclusively, to controlling power transistors in a bridge circuit as provided, for example, in a DC-DC converter or in the inverter bridge of a frequency converter for controlling the speed of electric motors.

BACKGROUND OF THE INVENTION

A conventional frequency converter, be it a single-phase or a three-phase circuit, comprises a rectifier bridge whose output is applied to an inverter. The inverter includes as many switching arms as there are phases to be fed, with each switching arm comprising a high rail transistor in series with a low rail transistor. Each transistor is associated with a regeneration diode. An intermediate point between the transistors is connected to one of the power windings of a motor.

A well-known problem in this type of converter lies in the fact that when both transistors in the same arm are simultaneously off while a current is flowing via one of the regeneration diodes, e.g. the high rail diode, the collector-emitter path of the high rail transistor is subjected to a negative voltage equal to the threshold voltage of the diode. Consequently, the base-collector junction of the transistor is forward biased and this gives rise to an accumulation of charge which must be evacuated in one way or another in order to avoid comprising proper operation of the inverter. The same problem exists with the low rail transistors when the low rail diodes are conducting.

Such a problem is easily solved with MOS type power transistors since charge is the majority carrier and it suffices merely to discharge the gate-source capacitance in which the charge accumulates. That is why this type of device is commonly used for switching in low power frequency converters.

However, when it is desired to work at higher powers, the high cost of MOS transistors becomes a major economic factor, and cheaper bipolar transistors are preferred. But then the above-mentioned problem applies in full: it is necessary to provide negative bias to the base of the transistor in order to evacuate the charge which tends to accumulate in the basecollector junction, with the charge now being constituted by minority carriers.

Any solution to the problem must take account of the fact that the emitters of the low rail transistors are referenced to a fixed potential whereas the emitters of the high rail transistors are referenced to a floating potential.

Known solutions for applying the desired negative bias are disadvantageous with respect both to cost and to bulk. In particular, the use of a transformer introduces stray capacitance which is prejudicial to proper operation of the converter, in particular at high switching frequencies.

The present invention seeks to avoid using a transformer and to mitigate the drawbacks of the prior art by proposing a switching circuit in which the required positive and negative bias is applied to the control electrode of a bipolar power transistor or of a power stage including such a transistor by means of an electronic circuit which is simple, compact, cheap, and capable of being integrated, and which has very low stray capacitance.

SUMMARY OF THE INVENTION

To this end, the present invention provides a power switching circuit including at least one bipolar transistor stage and a control circuit for said stage, the control circuit including first bias means for applying forward bias to said stage during first time intervals, and second bias means for applying reverse bias to said stage during second time intervals, said reverse bias being intended to prevent charge accumulating in the transistor while it is subjected to a reverse voltage. The first bias means comprise a first capacitor and a first switching circuit for selectively charging the first capacitor by means of a DC voltage source outside the first time intervals and for discharging the first capacitor into a control input of said stage; and the second bias means comprise a second capacitor and a second switching circuit for selectively charging the second capacitor from the voltage supply outside the second time intervals, and for discharging the second capacitor into the control input.

Thus, merely by using a single capacitor charged by the same voltage source as is used for forward bias, and by discharging the capacitor at appropriate instants, the invention makes it possible to apply the reverse bias required by the transistor for protection purposes during all time intervals for which its collector-emitter voltage goes negative.

Preferred aspects of the power switching circuit of the invention are as follows:

the first capacitor has a first terminal selectively connectable to the voltage source and to the control input of the power stage, and a second terminal connected to the current output terminal of the power stage; and the first switching circuit comprises a first switch for isolating the first terminal of the first capacitor from the control input while the capacitor is charging, and a first blocking means for isolating the voltage source from the first terminal of the capacitor, at least during the first time intervals;

the second capacitor has a first terminal capable of being selectively connected to the voltage source and to the current output terminal of the power stage, and a second terminal capable of being selectively connected to the current output terminal and to the control input of the power stage; and the second switching circuit comprises second and third switches serving respectively, while the second capacitor is charging, for isolating the first terminal of the second capacitor from the current output of the power stage, and for isolating the second terminal of the second capacitor from the control input of said stage, and second and third blocking means serving respectively, during the second time intervals, for isolating the first terminal of the second capacitor from the voltage source, and for isolating the second terminal of the second capacitor from the current output;

the first and third switches are constituted by the same transistor switch having a control input under the control of a control signal, with its collector being connected firstly to the first terminal of the first capacitor via a resistor and secondly to the control input of the power stage, and with its emitter being connected to to the second terminal of the second capacitor;

the first and second blocking means comprise in common a first diode connected between the voltage source and the respective first terminals of the first and second capacitors;

the first and second blocking means also comprise respective second and third diodes connected between the first diode and the first terminals of the first and second capacitors;

when the power stage is a high rail power stage of an inverter connected in series with a low rail power stage between a high rail conductor and a low rail conductor, the voltage source is referenced on the low rail conductor and the first and second blocking means are controlled by changes in the sign of the potential difference between the input point of the voltage source and the current output terminal of the high rail stage;

the second switch comprises a transistor having a control input associated with a fourth switch itself controlled by the changes in potential, with a current input terminal thereof being connected to the first terminal of the second capacitor and with a current output terminal thereof being connected to the current output terminal of the power stage;

the fourth switch comprises a transistor whose control input is connected to the output of a divider bridge connected across the terminals of the first capacitor;

the third blocking means comprise a diode connected between the second terminal of the second capacitor and the current output of the power stage;

the forward bias control signal controls the first and third switches via an optocoupler;

the power stage may be selected from the following: a series connection of an MOS transistor and a bipolar transistor; a Darlington circuit having two bipolar transistors; a single bipolar transistor; and an insulated gate bipolar transistor; and the second switch comprises an MOS transistor whose gatesource capacitance together with a resistance in series with the gate determines a time constant fixing the time during which said MOS transistor is conductive.

BRIEF DESCRIPTION OF THE DRAWINGS

An embodiment of the invention is described by way of example with reference to the accompanying drawings, in which:

FIG. 3 is a detailed circuit diagram of a control circuit in accordance with the present invention.

DETAILED DESCRIPTION

Figure 1:
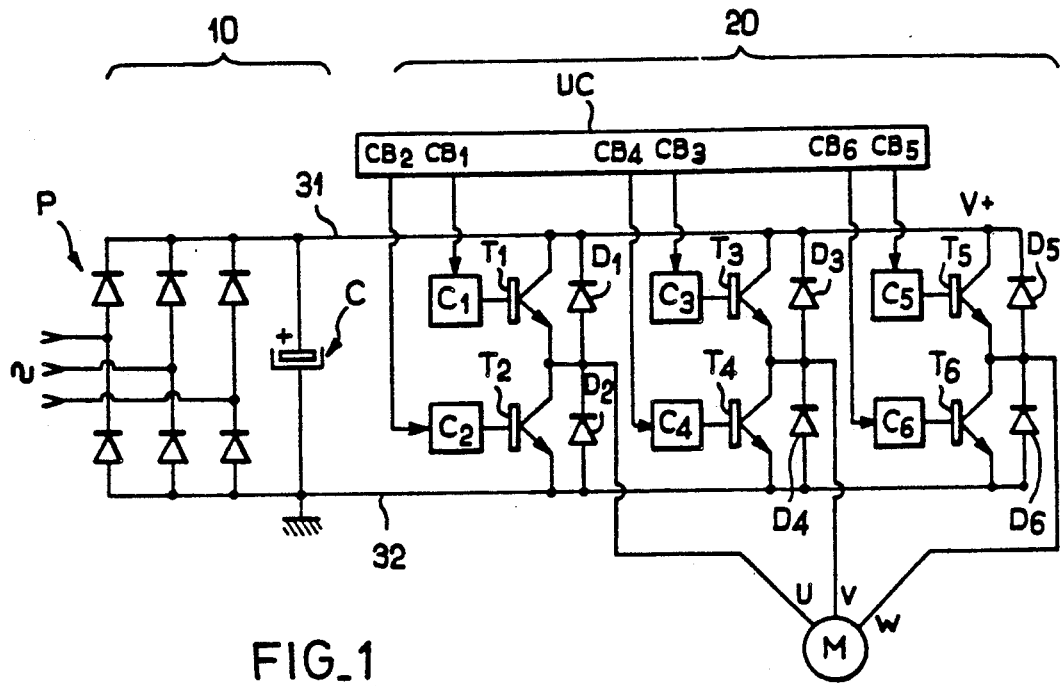
FIG. 1 is a block diagram of a frequency converter to which the present invention applies.

With reference initially to FIG. 1, a static frequency converter circuit, in particular for controlling the speed of an asynchronous motor, is connected to a single-phase or a multi-phase AC power supply, which in this case is a three-phase supply.

The converter is of the voltage wave type and includes a three-phase rectifier circuit 10 and an inverter 20. The rectifier circuit 10 is constituted by a six-diode rectifier bridge P connected to the phases of the power supply and a filtering capacitor C so as to deliver DC to the inverter via a high rail conductor 31 and a low rail conductor 32.

The input of the inverter 20 is connected to the two conductors 31 and 32, and its output is connected to three phase conductors U, V, and W of an asynchronous motor M. The motor M could alternatively be a synchronized asynchronous motor.

The inverter 20 comprises six controlled static switches connected in a Gratz bridge circuit and conventionally constituted by transistors T1 to T6 such as bipolar transistors. The emitter-collector terminals of transistors are connected in parallel with respective regeneration diodes or "free wheel" diodes D1 to D6.

Each arm of the bridge comprises one pair of transistors: a "high rail" transistor T1, T3, or T5, and a "low rail" transistor T2, T4, or T6. The midpoint of each pair of transistors is connected to a stator impedance in the motor M, (not shown in detail).

The bases of the transistors T1 to T6 are controlled by six respective associated control circuits C1 to C6, of the type suitable for delivering pulse width modulated (PWM) control signals to said bases in order to control the speed of rotation of the motor in a manner well known per se. Finally, a control unit UC, e.g. including a microprocessor, delivers appropriate control signals CB1 to CB6 to the control circuits C1 to C6.

Figure 2:
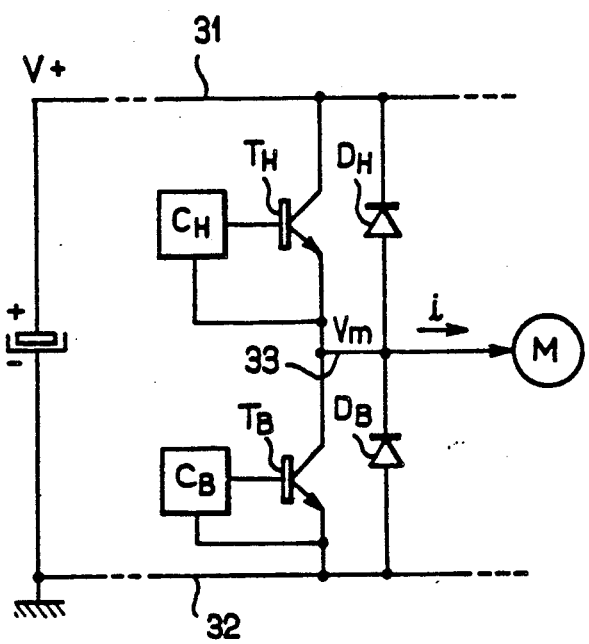
FIG. 2 is a circuit diagram of a portion of the FIG. 1 circuit and serving to illustrate the problem solved by the present invention.

FIG. 2 shows one stage of the FIG. 1 inverter, and is intended to illustrate the problem which is solved by the present invention. In this figure, the high rail transistor and diode are referenced TH and DH, whereas the low rail transistor and diode are designated by referenced TB and DB. Similarly, the high rail and low rail control circuits are respectively designated CH and CB. The DC voltage provided by the rectifier is symbolized by a generator delivering a voltage V+.

If voltages are referenced to the potential of the low rail conductor 32 (0 volts), then the voltage Vm present at the midpoint of the transistor pair (on line 33) is either substantially zero (when TB or DB is conducting), or else substantially equal to V+ (when TH or DH is conducting).

This means that the reference voltage of control circuit CH engaged with the emitter of TH is floating whereas the reference voltage for control circuit CB engaged with the emitter of TB is constant. In practice, this means that an individual floating power supply is required for each of the control circuits CH, whereas the control circuits CB may be powered from a common supply referenced on the low rail conductor 32.

A control circuit in accordance with the invention is now described in detail with reference to FIG. 3.

The circuit described is the circuit C5 associated with high rail power transistor T5 of the inverter. A positive DC voltage Vp, e.g. about 15 volts, is applied to this circuit. This voltage is applied between a power supply line 34 and the low rail conductor 32 of the converter which is assumed to be grounded. The circuit C5 has an input CB5 on which it receives a control signal for the transistor T5.

The input CB5 is connected to Vp via the light-emitting diode (LED) of an optocoupler PH3 connected in parallel with a resistor R156. The line 34 is connected via a series connected diode D149, resistor R124, and another diode D120, to the positive terminal of a positive bias capacitor C108 whose negative terminal is connected to the midpoint 33 between the transistors T5 and T6 at which the voltage Vm appears.

The line 34 is also connected via series-connected diode D149, resistor R123, and another diode D119 to the drain D of a MOS transistor T114 and to the positive terminal of a negative bias capacitor C107 whose negative terminal is connected, inter alia, to the emitter of the phototransistor in the coupler PH3.

In addition, two resistors R125 and R132 are connected in series between the cathode of the diode D149 and the line 33 at reference voltage Vm, constituting a voltage divider bridge for biasing the base of an NPN bipolar transistor T111 whose emitter is connected to the line 33 and whose collector is connected firstly to the cathode of diode D120 via a collector resistor R126 and secondly to the gate of MOS transistor T114 via a parallel-connected resistor R131 and diode D122.

The base of the phototransistor in optocoupler PH3 is connected via a diode to a resistor R127 which is connected to the cathode of D120 and to the cathode of a protective zener diode D121. In addition, the collector of the phototransistor in PH3 is connected to the base of a transistor T112 which constitutes a Darlington pair together with a transistor T113, a resistor R128 connecting the base of T112 to the cathode of D120. A resistor R129 connects the collectors of T112 and T113 to the cathode of D120.

The emitter of the phototransistor is connected to the anode of the zener diode D121, to the emitter of T113, and to the emitter-base connection in the Darlington pair T112-T113 via a resistor R130. As mentioned above, the negative terminal of capacitor C107 is also connected to a common point between the emitter of the phototransistor and the emitter of T113.

A diode D123 is connected between said point and the line 33 which is also connected to the source of T114.

The collectors of the Darlington pairs T112-T113 are connected to the line 33 firstly via a capacitor C109 and secondly via a series connection of a zener diode D124 and a diode D125 with opposite directions of forward conductivity. They are also connected via a resistor R133 to the gate of a MOS transistor T115. The transistor T115 controls the transistor T5 and together therewith constitutes a MOS-bipolar power stage.

More precisely, the source of T115 is connected to the base of T5 via connection point B5, and is connected to the gate of T115 via a diode D127. The emitter of T5 is connected to the reference line 33 via connection point E5 and to the anode of the associated regeneration diode D5. This point, which is the midpoint between the switching transistors T5 and T6 associated with the phase W of the motor, is also connected to the collector of transistor T6 and to the cathode of the regeneration diode D6, and in a manner not shown, to the associated phase of the motor being controlled. The voltage V+ present on the high rail conductor 31 is connected to the drain of MOS transistor T115, to the collector of T5, and to the cathode of diode D5.

The capacitor C108 constitutes a voltage source which is charged while the transistor is OFF and which is then used for applying positive bias to said transistor in order to make it conduct.

In addition, the portion of the circuit constituted by PH3, T112-T113, R128, R130, and D123 constitutes the control circuit per se for the MOS-bipolar power stage T115-T5, serving, in co-operation with the capacitor C108, to cause the transistor T5 to alternate between being switched OFF and being switched ON.

The operation of the above-described circuit is described below.

The transistor T5 is controlled by applying a control signal to the terminal CB5. In order to switch T5 OFF, the control circuit takes up a level lower than Vp, e.g. 0 volts. In order to switch T5 ON, the signal takes up the level Vp.

It is recalled that the transistors T5 and T6 are controlled to perform a complementary control cycle, as follows:

during time t1, T6 conducts while T5 is OFF;

during a short guard time interval, referenced t2, and lasting for about 15 μs for example, T5 and T6 are both OFF, thereby avoiding any danger of short-circuiting the high rail and low rail conductors 31 and 32;

during following time t3, T5 is ON while T6 remains OFF; and during a second guard time interval t4 serving the same purpose as t2, both T5 and T6 are OFF.

Considering time interval t1: T6 is ON, and the midpoint M between T5 and T6 and the conductor 33 are at 0 volts. In addition, since the signal CB5 is at its low level, the phototransistor PH3 is OFF. As a result, the base of T112 is positively biased via R128, and so the Darlington pair T112-T113 is ON.

Since the potential difference between the lines 34 and 33 is positive at this instant, and is practically equal to Vp, the positive bias capacitor C108 is recharged via D149, R124, and D120. The current flowing along conductor 34 passes through R129, T113, and D123, so that T115 and T5 remain OFF. In this respect, it may be observed that in this situation a positive voltage (substantially equal to the combined threshold voltages of T113 and D123) is nevertheless applied to the gate G of T115, but that this voltage is less than the threshold voltage of T115 and therefore does not cause it to conduct. Thus, T115 is advantageously used herein as a threshold device serving to overcome the voltage drops that occur in the various components of the circuit.

In addition, still because Vp-Vm is positive, a voltage substantially equal to Vp divided by the divider bridge R125, R132 is applied to the base of T111 which is therefore ON. Since the branch R126-T121 is ON, T114 is OFF. Consequently, the negative bias capacitor C107 charges via D149, R123, D119, and D123. While this charging is taking place, it should be observed that the diode D123 performs no particular function.

At the transition between intervals t1 and t2, transistor D6 turns OFF.

The voltage Vm then rises suddenly. As soon as Vm exceeds Vp, the diode D149 switches OFF as do the diodes D119 and D120. Consequently, current can no longer flow to the base of T111 which switches OFF. The gate of T114 thus has the voltage present across the terminals of C108 applied thereto via R126 and D122. T114 switches ON but discharges C108 only very little. In this situation, the diode D122 makes it possible to avoid excessively limiting the current flowing to the gate of T114, so that its gate-source capacitance charges as quickly as possible and the transistor T114 switches ON with a very short reaction time, as is required in order to protect the power stage, as explained below.

The base of transistor T111 may be controlled by a logic circuit L.

During the time interval t2, since the signal CB5 remains at its low level, the Darlington pair T112-T113 remains ON, as mentioned above. A loop circuit is thus established constituted by the positive terminal of C107, T114, the emitter-base path of T5, D127, R133, T113, and the negative terminal of C107. This circuit remains for as long as T113 and T114 continue to be ON. Thus, throughout time interval t2, negative base-emitter bias is applied to the transistor T5, with the bias voltage being delivered by the charged capacitor C107. The diode D122 is reverse biased during t2.

To sum up, the capacitor C107 charges during time interval t1 via the positive voltage Vp-Vm, and then it discharges via appropriate switching means constituted in particular by T113 and T114, with the negative electrode of the capacitor C107 being connected to the base of T5, and with its positive electrode being connected to the emitter of T5.

This negative bias avoids charge accumulating in transistor T5 while motor current is flowing through the regeneration diode D5 (as is normally the case when the transistor T6 switches OFF).

If it is desired to reduce the negative bias current of T5, a resistor (not shown) may be connected in series with the source-gate diode D127 of T115, adding its resistance to that of R133 and together determining the value of said current.

At the transition between time interval t2 and time interval t3, the control signal CB5 switches to a high level in order to switch transistor T5 OFF. Consequently, the LED in PH3 lights up and switches the phototransistor ON. The base-emitter voltage of T112 is brought back close to zero so the Darlington pair T112-T113 switches OFF. The negative bias circuit described above is immediately interrupted.

In addition, since T113 is OFF, the current available from the positive terminal of the positive bias capacitor C108 can now flow via R129 and R133 to the gate of T115. The MOS-bipolar stage T115-T5 is then positively biased and T5 conducts. It may be observed that even if its capacitance is modest, the capacitor C108 is suitable for maintaining this bias throughout the entire time interval t3, given that the current consumption of the gate of MOS type transistor T115 is very low.

It may be observed at this point that during time interval t3, C107 is not recharged by the positive potential difference between Vm and Vp given that transistor T114 prevents current from flowing to the positive terminal of C107. Simultaneously, diode D123 prevents this capacitor from discharging.

During the transition between t3 and t4, the signal CB5 returns to its low level so that Darlington pair T112-T113 switches ON again. This has two major consequences. Firstly, C108 can discharge through T113 and D123 so the positive bias applied to T115 collapses, and secondly the negative bias circuit created during time interval t2 is established and is reapplied to T5.

In this case, it is true that in theory the regeneration current will flow through D6 and no current is liable to flow through the diode D5. This new reverse bias therefore appears to be superfluous. However, it is no hindrance, and this solution has the advantage of avoiding complicating the circuit by additional switching means. Naturally, the person skilled in the art could design such additional switching means in order to avoid such bias.

When the cycle begins again, C107 and C108 recharge in order to apply the appropriate bias to T5 during subsequent interval t1, t3, and t4.

In a variant of the present invention, C108 may contribute to recharging C107. More precisely, a resistance connected in series with a diode (neither of which is shown) may be connected between the respective cathodes of D120 and D119, thereby enabling C108 to discharge at least in part into C107 while C107 is recharging.

It may be observed that the resistances selected for R126 and R131 depend on special considerations. More precisely, while C107 is discharging in order to apply negative bias to T5, it is particularly important to avoid switching T114 OFF in order to avoid switching the bias circuit OFF. In the present case, the resistor R131 and the gate-source capacitance of T114 act as a time constant for slowing down the voltage drop on the gate of T114 once the voltage Vp is no longer available due to the diodes D149, D119, and D120 being switched OFF. In addition, the resistance of R126, e.g. about one tenth the resistance of R131, must be selected to be sufficiently small to ensure that the transistor T114 is switched ON as quickly as possible, as mentioned above.

In practice, the resistance of R131 is selected as a function of the characteristics of the type of MOS transistor used for T114, to ensure that the above-mentioned time constant is greater than the above-mentioned time interval between T6 switching OFF and T6 switching ON.

The purpose of the zener diode D121 is to protect the optocoupler PH3, in particular by clipping any voltage peak which may appear between the emitter and the collector of the phototransistor during a sudden change in the value of Vm, and during various switching operations. In addition, it is because of the presence of D121, that it is necessary to ensure that the resistance of R127 is relatively high, so as to avoid said resistor applying a large charging current to C107.

When a frequency converter fitted with control circuits of the present invention is switched ON, it is necessary to charge the positive and negative bias capacitors. This is advantageously done by initially causing all of the low rail transistors to switch ON, which corresponds to time interval t1 in each of the phases during which these capacitors are recharged.

The present invention applies not only to controlling MOS-bipolar power stages, but also to controlling insulated gate bipolar transistors (IGBT), or bipolar transistors on their own or Darlington-connected. In this case, it is necessary to reconstitute the "threshold device" function offered by the input MOS transistor T115 in one way or another. One possibility would be to connect one or more diodes in series with the base of such a bipolar transistor or with the base of the first such transistor in a pair.

Although the circuit of the invention is most advantageously used for controlling transistors referenced to a floating potential, it could naturally be adopted for transistors referenced to a fixed potential.

The invention is applicable not only to the inverter bridges of frequency converters, but also to the bridges of DC-DC converters, and more generally on each occasion that a power transistor is controlled at a frequency which may be as high as several tens of kHz and which runs the risk of being subjected, when OFF, to a negative collector-emitter voltage.

In addition, the transistor T115 and/or the transistor T5 may be protected in other ways. Thus, the resistor R133 may be disposed upstream from the connection between the series connected diodes D124 and D125 with the gate of T115, and the diode D125 may be replaced by a zener diode.

We claim:
1. A power switching circuit including:
 (a) at least one bipolar transistor stage having a control input and a control circuit for said stage, said control circuit including first bias means for applying forward bias to said stage during first time intervals and second bias means for applying reverse bias to said stage during second time intervals different from said first time intervals, said reverse bias preventing charge accumulating in said transistor while said transistor is subjected to a reverse voltage, (b) a DC voltage source, (c) said first bias means comprising a first capacitor and a first switching circuit selectively charging said first capacitor means from said DC voltage source outside said first time intervals, and for discharging said first capacitor into said control input of said stage; and (d) said second bias means comprising a second capacitor and a second switching circuit for selectively charging said second capacitor from said voltage source outside said second time intervals, and for discharging the second capacitor into said control input.

2. A circuit according to claim 1, wherein:

(a) said first capacitor has a first terminal selectively connectable to said voltage source and to the control input of the power stage, and a second terminal connected to the current output terminal of the power stage; and (b) said first switching circuit comprises a first switch for disconnecting the first terminal of said first capacitor from said control input while said first capacitor is charging, and a first blocking means for disconnecting said voltage source from said first terminal of said first capacitor during said first time intervals.

3. A circuit according to claim 2, wherein:

the second capacitor has a first terminal capable of being selectively connected to the voltage source and to the current output terminal of the power stage, and a second terminal capable of being connected selectively to the current output terminal and to the control input of the power stage; and the second switching circuit comprises second and third switches serving respectively, while the second capacitor is charging, for isolating the first terminal of the second capacitor from the current output of the power stage, and for isolating the second terminal of the second capacitor from the control input of said stage, and second and third blocking means serving respectively, during the second time intervals, for isolating the first terminal of the second capacitor from the voltage source, and for isolating the second terminal of the second capacitor from the current output.

4. A circuit according to claim 2, wherein:

(a) the second capacitor has a first terminal capable of being selectively connected to the voltage source and to the current output terminal of the power stage, and a second terminal capable of being connected selectively to the current output terminal and to the control input of the power stage;

(b) the second switching circuit comprising a second switch and said first switch serving respectively, while the second capacitor is charging, for disconnecting the first terminal of the second capacitor from the current output of the power stage, and for disconnecting the second terminal of the second capacitor from the control input of said stage, and second and third blocking means serving respectively, during the second time intervals, for disconnecting the first terminal of the second capacitor from the voltage source, and for disconnecting the second terminal of the second capacitor from the current output; and (c) the first switch comprising a transistor switch having a control input under the control of a control signal, with its collector being connected firstly to the first terminal of the first capacitor via a resistor and secondly to the control input of the power stage, and with its emitters being connected to the second terminal of the second capacitor.

5. A circuit according to claim 4, wherein the transistor switch comprises a Darlington transistor pair.

6. A circuit according to claim 4, wherein the control signal controls the first and third switches via an optocoupler whose phototransistor is connected firstly to the control input of the transistor switch and secondly to the second terminal of the second capacitor.

7. A circuit according to claim 2, wherein:

(a) the second capacitor has a first terminal capable of being selectively connected to the voltage source and to the current output terminal of the power stage, and a second terminal capable of being connected selectively to the current output terminal and to the control input of the power stage;

(b) the second switching circuit comprising second and third switches serving respectively, while the second capacitor is charging, for disconnecting the first terminal of the second capacitor from the current output of the power stage, and for disconnecting the second terminal of the second capacitor from the control input of said stage, and second blocking means, incorporating part of said first blocking means, and third blocking means serving respectively, during the second time intervals, for disconnecting the first terminal of the second capacitor from the voltage source, and for disconnecting the second terminal of the second capacitor from the current output; and (c) said part of said first blocking means comprising a first diode connected between the voltage source and the respective first terminals of the first and second capacitors.

8. A circuit according to claim 7, wherein the first and second blocking means also comprise respective second and third diodes connected between the first diode and the first terminals of the first and second capacitors.

9. A circuit according to claim 7, in which the power stage is a high rail stage of an inverter, connected in series with a low rail stage between a high rail conductor and a low rail conductor, wherein the voltage source is referenced on the low rail conductor and wherein the first and second blocking means are controlled by changes in the sign of the potential difference between the input point of the voltage source and the current output terminal of the high rail stage.

10. A circuit according to claim 9, wherein the second switch comprises a transistor having a control input associated with a fourth switch itself controlled by the changes in potential, with a current input terminal thereof being connected to the first terminal of the second capacitor and with a current output terminal thereof being connected to the current output terminal of the power stage.

11. A circuit according to claim 10, wherein the fourth switch comprises a transistor whose control input is connected to the output of a divider bridge connected across the terminals of the first capacitor.

12. A circuit according to claim 10, wherein the second switch comprises an MOS transistor whose gate-source capacitance together with a resistance connected in series with the gate determines a time constant which fixes the time during which said MOS transistor is conductive.

13. A circuit according to claim 9, wherein the third blocking means comprise a diode connected between the second terminal of the second capacitor and the current output of the power stage.

* * * * *